United States Patent
Kim et al.

(10) Patent No.: US 12,441,769 B2
(45) Date of Patent: *Oct. 14, 2025

(54) POLYPEPTIDE, PHOTORESIST COMPOSITION INCLUDING THE SAME, AND METHOD OF FORMING PATTERN USING THE SAME

(71) Applicant: Samsung Electronics Co., Ltd., Suwon-si (KR)

(72) Inventors: Jieun Kim, Suwon-si (KR); Soonchun Chung, Seoul (KR); Jinha Kim, Hwaseong-si (KR); Joonsong Park, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 34 days.

This patent is subject to a terminal disclaimer.

(21) Appl. No.: 17/741,590

(22) Filed: May 11, 2022

(65) Prior Publication Data
US 2023/0183294 A1    Jun. 15, 2023

(30) Foreign Application Priority Data
Dec. 9, 2021 (KR) .................. 10-2021-0176113

(51) Int. Cl.
*C07K 14/00*    (2006.01)
*G03F 7/039*    (2006.01)

(52) U.S. Cl.
CPC .......... *C07K 14/001* (2013.01); *G03F 7/0392* (2013.01)

(58) Field of Classification Search
CPC .............. C07K 14/001; G03F 7/0392
See application file for complete search history.

(56) References Cited

U.S. PATENT DOCUMENTS

| | | | |
|---|---|---|---|
| 9,771,400 B2 | 9/2017 | Kurland et al. | |
| 2003/0091927 A1 | 5/2003 | Lee et al. | |
| 2004/0214272 A1 | 10/2004 | La Rosa et al. | |
| 2005/0090641 A1* | 4/2005 | Valluzzi ............... | B01J 31/062 525/54.1 |
| 2006/0248617 A1 | 11/2006 | Imanaka et al. | |
| 2008/0160446 A1 | 7/2008 | Meagley | |
| 2020/0171131 A1 | 6/2020 | Lawrence et al. | |
| 2020/0207819 A1 | 7/2020 | Johansson et al. | |
| 2022/0372078 A1 | 11/2022 | Chung et al. | |

FOREIGN PATENT DOCUMENTS

| | | |
|---|---|---|
| KR | 20170041275 A | 4/2017 |
| KR | 20180070709 A | 6/2018 |
| KR | 20220157526 A | 11/2022 |
| WO | 9116351 A1 | 10/1991 |
| WO | 2004022736 A1 | 3/2004 |

OTHER PUBLICATIONS

GenBank_CAA32076, examiner generated from: https://www.ncbi.nlm.nih.gov/protein/930003, Feb. 2, 2023. (Year: 2016).*
Mita et al., Specific Codon Usage Pattern and its Implications on the Secondary Structure of Silk Fibroin mRNA; J. Mol. Biol.; 203:917-925 (Year: 1988).*
Zhou et al., Silk Fibroin: Structural Implications of a Remarkable Amino Acid Sequence, PROTEINS: Structure, Function, and Genetics 44:119-122 (Year: 2001).*
Mita K, Ichimura S, Zama M, James TC. Specific codon usage pattern and its implications on the secondary structure of silk fibroin mRNA. J Mol Biol. Oct. 20, 1988;203(4):917-25. (Year: 1988).*
Zhou CZ, Confalonieri F, Jacquet M, Perasso R, Li ZG, Janin J. Silk fibroin: structural implications of a remarkable amino acid sequence. Proteins. Aug. 1, 2001;44(2):119-22. (Year: 2001).*
ScreenShots_AminoAcidWeights_Aug. 29, 2023. (Year: 2023).*
Database Geneseq [Online] (Mar. 25, 2003) "Amorphous domain of spider silk protein.", retrieved from EBI accession No. GSP:AAR14369 Database accession No. AAR14369, 1 pp.
Extended European Search Report issued in corresponding EP Patent Application No. 22173987.3, dated Dec. 20, 2022, 8 pp.
Joonhan Park et al., "Eco-friendly photolithography Using Water-Developable Pure Silk Fibroin," RSC Adv., 6, 2016, 11 pp.
Peter R. Laity et al., Changes in Silk Feedstock Rheology during CocoonConstruction: The Role of Calcium and Potassium Ions, Macromol. Biosci. 2019, 19, 11 pp.
Sunghwan Kim, et al., All-water-based electron-beam lithographyusing silk as a resist, Nature Nanotechnology, vol. 9, Apr. 2014, 5 pp.

* cited by examiner

*Primary Examiner* — Fred H Reynolds
*Assistant Examiner* — Sara E Konopelski Snavely
(74) *Attorney, Agent, or Firm* — CANTOR COLBURN LLP

(57) ABSTRACT

A polypeptide including a region A, a region B, and a region C, a photoresist composition including the polypeptide, and a method of forming patterns by using the photoresist composition.

17 Claims, 3 Drawing Sheets
Specification includes a Sequence Listing.

POLYPEPTIDE, PHOTORESIST COMPOSITION INCLUDING THE SAME, AND METHOD OF FORMING PATTERN USING THE SAME

CROSS-REFERENCE TO RELATED APPLICATION

This application claims priority under 35 U.S.C. § 119 to Korean Patent Application No. 10-2021-0176113, filed on Dec. 9, 2021, in the Korean Intellectual Property Office, and all the benefits accruing therefrom, the disclosure of which in its entirety is herein incorporated by reference.

INCORPORATION-BY-REFERENCE OF MATERIAL SUBMITTED ELECTRONICALLY

The Sequence Listing is incorporated by reference. The Sequence Listing submitted as an ASCII text file named '95U9221.txt', created on Apr. 20, 2023, and having a size of 11,124 bytes, is hereby incorporated by reference pursuant to 37 CFR 1.823(b)(1). The Sequence Listing contains no new subject matter.

BACKGROUND

1. Field

The present disclosure relates to a polypeptide, a photoresist composition including the polypeptide, and a method of forming patterns by using the photoresist composition.

2. Description of the Related Art

The high-integration of semiconductor devices has contributed to a growing need for higher resolution and more precise patterning in the devices. Chemically amplified materials are routinely used for photoresists; however, such materials can result in acid diffusion during photoresist development, which in turn, makes it more difficult to achieve fine or high-resolution patterns in a semiconductor device. Moreover, many of the present materials used to form and/or develop the photoresists may be potentially hazardous to human health and the environment.

Accordingly, there is a demand for eco-friendly photoresist materials that are suitable for achieving high-resolution patterns, e.g., in semiconductor devices, and reduce or eliminate the need for potentially hazardous chemicals in the patterning process or the release of such chemicals/materials into the environment.

SUMMARY

Provided is a polypeptide for a photoresist, and a photoresist composition including the polypeptide. In addition, provided is an eco-friendly method of forming patterns, e.g., patterns in a semiconductor device, by using the photoresist composition in a patterning process.

Additional aspects will be set forth in part in the description which follows and, in part, will be apparent from the description, or may be learned by practice of the presented embodiments of the disclosure.

A polypeptide according to an aspect includes a region A, a region B, and a region C, wherein the region A may have an alanine content of 20% or more and may include a first repeat unit having 4 to 10 consecutive amino acid residues, the region B may have a tyrosine content of 10% or more and may include a second repeat unit having 4 to 10 consecutive amino acid residues, and the region C may have a content of 50% or more of at least one of aspartic acid or glutamic acid, and includes a third repeat unit having 2 to 8 consecutive amino acid residues.

The third repeat unit may include at least one of aspartic acid or glutamic acid in a content of 70% or more.

The third repeat unit may consist of at least one of aspartic acid or glutamic acid.

The first repeat unit may be represented by the following Formula 1, the second repeat unit may be represented by the following Formula 2, and the third repeat unit may be represented by the following Formula 3.

$$X_{11}\text{-}(Ala\text{-}X_{12})n11\text{-}X_{13} \qquad \text{Formula 1}$$

$$X_{21}\text{-}(X_{22}\text{-}X_{23})n21\text{-}Tyr \qquad \text{Formula 2}$$

$$X_{31}\text{-}(X_{32}\text{-}X_{33})n31\text{-}X_{34} \qquad \text{Formula 3}$$

wherein in Formulae 1, 2, and 3, $X_{11}$ and $X_{12}$ are each independently Gly or Ala, $X_{13}$ is Ser or Ala, and n11 is an integer of 1 to 4, $X_{21}$ and $X_{23}$ are each independently Gly or Ala, $X_{22}$ is Gly, Ala, or Val, and n21 is an integer of 1 to 4, and $X_{31}$ to $X_{34}$ are each independently Asp or Glu, and n31 is an integer of 0 to 3.

In Formulae 1 and 2, $X_{11}$ and $X_{12}$ may each be Gly, $X_{13}$ may be Ser, n11 may be 1 or 2, $X_{21}$ and $X_{23}$ may each be Gly, $X_{22}$ may be Ala or Val, and n21 may be 1, 2, or 3.

The first repeat unit may be Gly-Ala-Gly-Ala-Gly-Ser (SEQ ID NO:1) or Gly-Ala-Ala-Ser (SEQ ID NO:2), the second repeat unit may be Gly-Ala-Gly-Tyr (SEQ ID NO:3), Gly-Ala-Gly-Ala-Gly-Tyr (SEQ ID NO:4), Gly-Ala-Gly-Val-Gly-Ala-Gly-Tyr (SEQ ID NO: 5), or Gly-Ala-Gly-Ala-Gly-Ala-Gly-Tyr (SEQ ID NO:6), and the third repeat unit may be Glu-Glu, Asp-Asp, Asp-Glu-Asp-Glu-Asp-Glu (SEQ ID NO:7), or Asp-Asp-Asp-Asp-Asp-Asp (SEQ ID NO:8).

The region A may include 1 to 20 of the first repeat units, the region B may include 1 to 20 of the second repeat units, and the region C may include 1 to 5 of the third repeat units.

In a polypeptide according to an embodiment, the region A, the region B, the region C may be consecutively arranged.

The polypeptide may further include a region H including-Gly-Ala-Ala-Ser (SEQ ID NO: 9).

The region H may be represented by Formula 4:

$$X_{41}\text{-}(Ala\text{-}X_{42})_{n41}\text{-}X_{43}\text{-}Gly\text{-}Ala\text{-}Ala\text{-}Ser, \qquad \text{Formula 4}$$

wherein in Formula 4, $X_{41}$ and $X_{42}$ are each independently Gly or Ala, $X_{43}$ is Ser or Ala, and n41 is 1 or 2 (SEQ ID NO:21).

The region H may be -Gly-Ala-Gly-Ala-Gly-Ser-Gly-Ala-Ala-Ser (SEQ ID NO: 10).

The region H may have a viscosity of less than 70 milliPascals seconds (mPa·s) at 25° C.

A photoresist composition according to another aspect may include a polypeptide described above and water.

The photoresist composition may have a polypeptide concentration of about 0.1 percent weight per volume (w/v %) to about 20 w/v %.

A method of forming patterns according to still another aspect includes:

applying the photoresist composition with a polypeptide concentration of about 0.1 w/v % to about 20 w/v % onto a substrate;

heating the photoresist composition to form a photoresist film;

exposing at least a portion of the photoresist film to high-energy light; and developing the exposed photoresist film with a developer.

In the method, the heating may be performed at about 50° C. to about 95° C.

In the method, the high-energy light may have a wavelength of 200 nm or less.

In the method, the high-energy light may be sourced from an ArF excimer laser having a wavelength of 193 nm.

In the method, the developer may consist of water.

In the method, the exposed of the photoresist film exposed to the high-energy light may be water-soluble, and a portion of the photoresist film not exposed may be water-insoluble.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
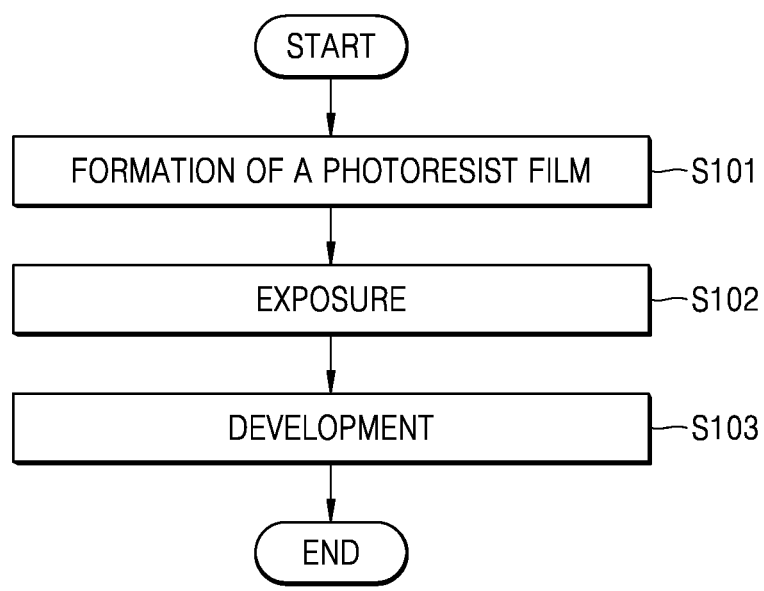
FIG. 1 is a flowchart showing a method of forming patterns, according to an embodiment of the present disclosure.

Reference will now be made in detail to embodiments, embodiments of which are illustrated in the accompanying drawings, wherein like reference numerals refer to like elements throughout. In this regard, the present embodiments may have different forms and should not be construed as being limited to the descriptions set forth herein. However, the present invention is not to be limited by the present disclosure of the particular embodiments, and it should be understood that the present disclosure covers all the modifications, equivalents, and replacements within the idea and technical scope of the present disclosure. In describing the present disclosure, detailed descriptions of related known art will be omitted when it is determined that the detailed descriptions may obscure the gist of the present disclosure.

It will be understood that, although the terms "first," "second," "third," etc., may be used herein to describe various elements, components, regions, layers and/or sections, and the terms are only used to distinguish one element component, region, layer and/or section, from another element, component, region, layer, or section. Thus, "a first element," "component," "region," "layer," or "section" discussed below could be termed a second element, component, region, layer, or section without departing from the teachings herein.

As used herein, when an element such as a layer, a film, a region, or a substrate is referred to as being "on" or "above" another element, it may be right above, below, left, or right and directly on the other element or intervening elements may be present therebetween. In contrast, when an element, a layer, a film, or a region, is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" indicates the presence of a characteristic, a number, a phase, a movement, an element, a component, or combinations of components described in the specification, and it should not be construed to exclude in advance the existence or possibility of existence of at least one of other characteristics, numbers, movements, elements, components, or combinations of components.

Wherever a range of values is recited, that range includes every value falling within the range, as if written out explicitly, and further includes the values bounding the range. Thus, a range of "from X to Y" includes every real number value falling between X and Y, and includes X and Y.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +10% or +5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thicknesses of layers and regions are enlarged for a clear description. In addition, in the drawings, the thicknesses of some layers and regions are exaggerated for convenience of description. Meanwhile, embodiments described herein are merely examples and various forms of modifications from these embodiments are possible.

Polypeptide

As used herein, the term "repeat unit" refers to four or more consecutive amino acid residues, i.e., four or more amino acid residues in a continuous, interrupted stretch within a polypeptide, and refers to a subsequence that is repeated within a larger sequence. In this case, it is not necessary that only sequences with exactly identical repeat units be repeated. Repeat units may include variable compositional elements, and due to the variable compositional elements, each repeat unit may vary randomly within the same region. The repeat unit (i.e., subsequence), may be repeated consecutively or non-consecutively. For example, the subsequences may be repeated with no intervening amino acids, or with one or more intervening amino acids between the subsequences, where each intervening amino acid may be the same or different.

As used herein, the term "region" refers to two or more consecutive amino acid residues in a continuous (i.e., consecutive or uninterrupted) stretch within a polypeptide, and a region includes at least one repeat unit.

A polypeptide according to example embodiments includes a region A, a region B, and a region C, wherein the region A may have an alanine content of 20% or more and may include at least one first repeat unit having 4 to 10 consecutive amino acid residues, and the region B may have a tyrosine content of 10% or more and may include at least one second repeat unit having 4 to 10 consecutive amino acid residues, and the region C has a content, of 50% or more, of at least one of aspartic acid and glutamic acid, and includes at least one third repeat unit having 2 to 8 consecutive amino acid residues.

The polypeptide includes 4 or more, 6 or more, 10 or less, or 8 or less amino acid residues within each of the first repeat unit and the second repeat unit. The polypeptide includes 2 or more, 4 or more, 6 or more, or 8 or less amino acid residues within the third repeat unit.

In an embodiment, the region A, the region B, and the region C may be consecutively arranged in the polypeptide. That is, the polypeptide may have no other sequence present between the region A and the region B, and a C-terminal of the region A and a N-terminal of the region B may form a peptide bond. In addition, the polypeptide may have no other sequence present between the region B and the region C, and a C-terminal of the region B and a N-terminal of the region C may form a peptide bond. In another embodiment, the polypeptide may consist of the region A, the region B, and the region C.

The region A may include alanine (Ala). Specifically, since the region A has alanine content of 20% or more, and one or more first repeat units including 4 to 10 consecutive amino acid residues, an amount of alanine in the region A may be 20% or more, 25% or more, 30% or more, 35% or more, 40% or more, 50% or less, or 45% or less. The first repeat unit may have an alanine content of 20% or more, 25% or more, 30% or more, 35% or more, 40% or more, 50% or less, or 45% or less. Here, the alanine content in the region A was calculated from the percentage of a number of alanine residues with respect to the number of all amino acid residues constituting the region A. Likewise, the alanine content in the first repeat unit was calculated from the percentage of a number of alanine residues with respect to the number of all amino acid residues constituting the first repeat unit. The region A may be consisted of a sequence capable of forming a β-strand. Although not limited to a particular theory, since the region A includes alanine, it may be relatively hydrophobic and may form a crystalline region that is considered to be formed by a β-sheet stacking.

The region B may include tyrosine (Tyr). Specifically, since the region B has a tyrosine content of 10% or more and one or more second repeat units including 4 to 10 consecutive amino acid residues, an amount of tyrosine in the region B may be 10% or more, 15% or more, 20% or more, 25% or more, 30% or more, 40% or less, or 35% or less. The second repeat unit may have a tyrosine content of 10% or more, 15% or more, 20% or more, 25% or more, 30% or more, 40% or less, or 35% or less. Here, the tyrosine content in the region B was calculated from the percentage of a number of tyrosine residues with respect to the number of all amino acid residues constituting the region B. Likewise, the tyrosine content in the second repeat unit was calculated from the percentage of a number of tyrosine residues with respect to the number of all amino acid residues constituting the second repeat unit. The region B may be consisted of a sequence having reactivity to high-energy rays. Although not limited to a particular theory, since the region B includes tyrosine, it may react to a radiation having a wavelength of 200 nm or less, or specifically, 193 nm. Particularly, in the region B under a high-energy radiation, the bond between the phenyl ring of tyrosine and the main backbone chain may be broken to form a quinone methide, and the quinone methide may break the hydrogen bonds between B sheets of the region A and change the solubility of the peptide in water. That is, because of the presence of the region B, the solubility of the polypeptide in water is changed by high-energy rays.

The region C may include at least one of aspartic acid and glutamic acid. Specifically, since the region C has a content, of 50% or more, of at least one of aspartic acid and glutamic acid, and includes at least one third repeat unit having 2 to 8 consecutive amino acid residues, an amount of at least one of aspartic acid and glutamic acid in the region C may be 50% or more, 60% or more, 70% or more, 80% or more, 90% or more, or 100%. For example, the region C may consist of aspartic acid and glutamic acid. The third repeat unit may have at least one of aspartic acid and glutamic acid in a content of 50% or more, 60% or more, 70% or more, 80% or more, 90% or more, or 100%. For example, the third repeat unit may consist of aspartic acid and glutamic acid. Here, the amount of at least one of aspartic acid and glutamic acid in the region C was calculated from the percentage of a number of aspartic acids and glutamic acids with respect to the number of all amino acid residues constituting the region C. Likewise, the amount of at least one of aspartic acid and glutamic acid in the third repeat unit was calculated from the percentage of a number of aspartic acids and glutamic acids consisting the third repeat unit with respect to the number of all amino acid residues constituting the region C. The region C may be consisted of a sequence of amino acids having a negative charge. Although not limited to a particular theory, the higher the molecular weight of the region A and the region B, the more the viscosity of the polypeptide tends to increase. However, when the region C is further included in the polypeptide, since the region C consists of aspartic acid and glutamic acid, hydrophilicity of the polypeptide may be increased and a viscosity may be lowered. That is, as the region C is present, the polypeptide may be used as a photoresist composition which may be spin-coated.

In an embodiment, the first repeat unit may be represented by Formula 1:

$$X_{11}\text{-}(Ala\text{-}X_{12})n11\text{-}X_{13}, \qquad \text{Formula 1}$$

wherein in Formula 1, $X_{11}$ and $X_{12}$ are each independently Gly or Ala, $X_{13}$ is Ser or Ala, and n11 is an integer of 1 to 4.

In an embodiment, the first repeat unit of Formula 1 may be as follows, $X_{11}$ and $X_{12}$ may each be Gly, $X_{13}$ may be Ser, and n11 may be 1 or 2.

In an embodiment, the first repeat unit may be Gly-Ala-Gly-Ala-Gly-Ser (SEQ ID NO: 1) or Gly-Ala-Ala-Ser (SEQ ID NO:2).

In an embodiment, the second repeat unit may be represented by Formula 2:

$$X_{21}\text{-}(X_{22}\text{-}X_{23})n21\text{-}Tyr, \qquad \text{Formula 2}$$

wherein in Formula 2, $X_{21}$ and $X_{23}$ are each independently Gly or Ala, $X_{22}$ is Gly, Ala, or Val, and n11 is an integer of 1 to 4.

In an embodiment, the second repeat unit of Formula 2 may be as follows, $X_{21}$ and $X_{23}$ may each be Gly, $X_{22}$ may be Ala or Val, and n21 may be 1, 2, or 3.

In an embodiment, the second repeat unit of Formula 2 may be as follows, Gly-Ala-Gly-Tyr (SEQ ID NO:3), Gly-Ala-Gly-Ala-Gly-Tyr (SEQ ID NO:4), Gly-Ala-Gly-Val-Gly-Ala-Gly-Tyr (SEQ ID NO:5), or Gly-Ala-Gly-Ala-Gly-Ala-Gly-Tyr (SEQ ID NO:6).

In an embodiment, the third repeat unit may be represented by Formula 3:

$X_{31}$-$(X_{32}$-$X_{33})$n31-$X_{34}$  Formula 3 wherein in Formula 3, $X_{31}$ to $X_{34}$ are each independently Asp or Glu, and n31 is an integer of 0 to 3.

In an embodiment, the third repeat unit of Formula 3 may include n31 as an integer of 0 to 2.

In an embodiment, the third repeat unit of Formula 3 may be as follows, Glu-Glu, Asp-Asp, Asp-Glu-Asp-Glu-Asp-Glu (SEQ ID NO:7), or Asp-Asp-Asp-Asp-Asp-Asp (SEQ ID NO:8).

The polypeptide may include 1 to 20 repeat units in each region. In an embodiment, the region A may include 1 to 20 of the first repeat units, the region B may include 1 to 20 of the second repeat units, and the region C may include 1 to 5 of the third repeat units. In an embodiment, the region A may include 1 or more, 2 or more, 4 or more, 6 or more, and 20 or less, 16 or less, 12 or less, 8 or less, or 7 or less of the first repeat units, the region B may include 1 or more, 2 or more, 3 or more, and 7 or less, 6 or less, or 4 or less of the second repeat units, and the region C may include 1 or more, 2 or more, and 5 or less, 4 or less, or 3 or less of the third repeat units.

In an embodiment, the polypeptide may further include a region H including Gly-Ala-Ala-Ser (SEQ ID NO:9). Specifically, the region A may be interposed between the region H and the region B. In the polypeptide, the region H, the region A, and the region B may be consecutively arranged. That is, the polypeptide may have no other sequence present between the region H and the region A, between the region A and the region B, and a C-terminal of the region H and a N-terminal of the region A may be form a peptide-bond. In an embodiment, the polypeptide may consist of the region H, the region A, the region B, and a region C.

The region H may include 4 to 10 consecutive amino acid residues.

The region H may be represented by Formula 4:

Formula 4

$X_{41}$-$(Ala$-$X_{42})$n41-$X_{43}$-Gly-Ala-Ala-Ser,  (SEQ ID: 21)

wherein in Formula 4, $X_{41}$ and $X_{42}$ are each independently Gly or Ala, $X_{41}$ is Ser or Ala, and n41 is 1 or 2.

In an embodiment, the region H may be Gly-Ala-Gly-Ala-Gly-Ser-Gly-Ala-Ala-Ser (SEQ ID NO: 10).

In an embodiment, the polypeptide may have a weight average molecular weight of 10,000 grams per mole (g/mol) or less, and specifically, the polypeptide may have a molecular weight of about 3,000 g/mol to about 10,000 g/mol. The polypeptide is clearly different from proteins that form fibers having a molecular weight of greater than 10,000 g/mol. When the polypeptide has a molecular weight of greater than 10,000 g/mol, the polypeptide may have reduced solubility in solvents, particularly water, and thus may not be suitable for preparing a photoresist composition and/or may not have a satisfactory viscosity for applying the photoresist composition onto a substrate. When the molecular weight of the polypeptide satisfies the range described above, the polypeptide may have a viscosity and/or solubility suitable for use as a photoresist composition.

As used herein, "molecular weight" refers to a weight average molecular weight.

In an embodiment, the polypeptide may have a polydispersity index of 2 or less. Specifically, the polypeptide may have a polydispersity index of 1. The polypeptide is not obtained by being extracted from natural proteins, and instead, is obtained by using a microorganism-based protein production technology, and thus may have a low polydispersity index. As the polydispersity index of the polypeptide is relatively low, performances suitable for use as a photoresist composition, such as improved resolution, reduced line-edge-roughness (LER), and/or reduced line-width-roughness (LWR) may be provided.

In an embodiment, the polypeptide may have a crystallinity of 40% or more. In an embodiment, the polypeptide may have a crystallinity of 43% or more. When the crystallinity satisfies the range described above, a reduced LER, and/or a reduced critical dimension (CD) may be provided. A method of determining a crystallinity is described later.

In an embodiment, the polypeptide may have a viscosity of less than 70 mPa·s at 25° C. When the viscosity satisfies the range describe above, the polypeptide may be suitable for manufacturing a photoresist composition, particularly a photoresist composition that can be spin-coated.

In an embodiment, an isoelectric point (pI) of the polypeptide may be not more than 6.0 and not less than 4.0. When the isoelectric point satisfies the range describe above, water solubility of the polypeptide may be high enough to make a photoresist composition with the polypeptide. Here, isoelectric point (pI) is a value calculated based on the sequence, and may be calculated by, for example, using protein-sol software.

In an embodiment, water solubility of the polypeptide may be 0.65 g/mL or more at 25° C. Specifically, water solubility of the polypeptide may be 0.70 g/mL or more to 0.90 g/mL or less at 25° C. When the water solubility satisfies the range describe above, the polypeptide may be suitable for manufacturing a photoresist composition, particularly a photoresist composition that can be spin-coated. Here, solubility is a value calculated based on the sequence, and may be calculated by, for example, using protein-sol software.

Photoresist Composition

A photoresist composition according to example embodiments may include the polypeptide described above and water.

In an embodiment, the photoresist composition may consist of the polypeptide and water. Unlike photoresist compositions of the related art that include organic solvents, matrix materials, and the like, the photoresist composition in accordance with an embodiment including a polypeptide and water may alone function as a photoresist composition. For example, a photoresist composition in accordance with an embodiment may not include organic resins known in the photoresist art or non-alcoholic organic solvents. The use of peptide and water, which are generally recognized by those of ordinary skill to be eco-friendly materials, as a photoresist composition may reduce the frequency of exposure to toxic substances in semiconductor manufacturing processes, may simplify the disposal of waste liquid generated after the semiconductor manufacturing processes, and therefore, significantly reduce costs of production. In addition, as a photoresist composition described herein is not a chemically amplified photoresist, it does not cause image degradation due to acid diffusion, which is a technical shortcoming of a chemically amplified photoresist, and thus may form relatively high resolution or precise patterns, e.g., patterns in a semiconductor device.

The photoresist composition may have a polypeptide concentration of about 0.1 percent weight per volume (w/v %) to about 20 w/v %. Specifically, the photoresist composition may have a polypeptide concentration of about 0.5 w/v % to about 10 w/v %.

Method of Forming Patterns

Hereinafter, a method of forming patterns according to one or more embodiments will be described in more detail with reference to FIGS. 1 and 2. FIG. 1 is a flowchart showing a method of forming patterns, according to an embodiment, and FIG. 2 is a side cross-sectional view showing a method of forming patterns according to an embodiment.

Referring to FIG. 1, a method of forming patterns includes: applying a photoresist composition according to an embodiment onto a substrate; heating the applied photoresist composition to form a photoresist film (S101); exposing at least a portion of the photoresist film to high-energy light (S102); and developing the exposed photoresist film with a developer (S103).

Figure 2:
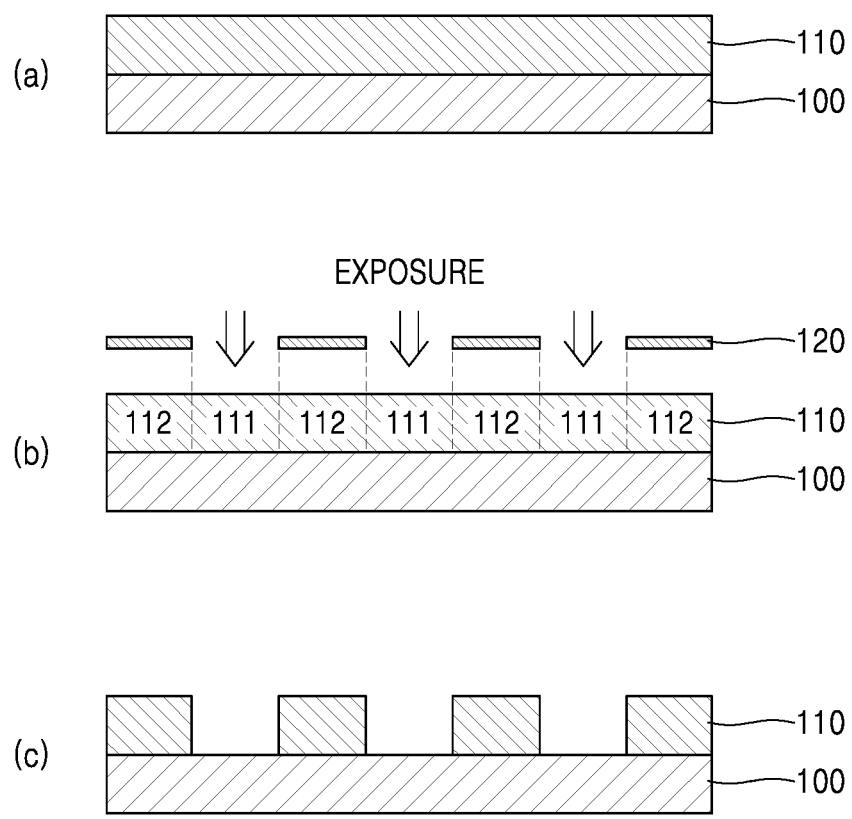
FIG. 2 is a side cross-sectional view showing a method of forming patterns, according to an embodiment of the present disclosure.

As depicted in FIG. 2, a substrate 100 is provided. Examples of the substrate 100 may include semiconductor substrates such as a silicon substrate or a germanium substrate, glass, quartz, ceramic, copper, or the like. In some embodiments, the substrate 100 may include a Group III-V compound such as GaP, GaAs, GaSb, or the like.

A photoresist composition according to an embodiment may be applied to the substrate 100 to a desired thickness using a coating method to form a preliminary photoresist film (not shown), and the preliminary photoresist film may be heated to form a photoresist film 110. Examples of the coating method may include spin coating, dipping, roller coating, or other common coating methods known in the semiconductor art. Among the methods, particularly, spin coating may be used, and a photoresist film 110 having a desired thickness may be formed by regulating the viscosity, concentration, and/or spin speed of the photoresist composition. Specifically, the photoresist film 110 may have a thickness of about 10 nm to about 300 nm. More specifically, the photoresist film 110 may have a thickness of about 30 nm to about 200 nm.

When the photoresist composition is applied to the substrate 100, the polypeptide may be water-soluble due to the fact that the polypeptide has a molecular structure in the form of a random coil, and thus, may have weak intermolecular attractions. As the polypeptide is water-soluble, the polypeptide needs to be made water-insoluble to provide a positive-tone development using water in a development process which will be described later, and in this case, a method of heating a preliminary photoresist film to remove moisture may be used. Specifically, when the preliminary photoresist film is heated to remove moisture, the region A of the polypeptide may form a hydrogen bond and crystallize into a β-sheet structure, and accordingly, the polypeptide may become water-insoluble.

The heating may be performed at about 50° C. to about 95° C., or at about 80° C. to about 95° C. Heating at a relatively high temperature may increase the extent of crystallinity of the polypeptide, thereby providing reduced LER and/or reduced LWR.

The heating may be performed at a relative humidity of about 92% or greater.

The heating may be performed for about 1 hour to 20 hours, 2 hours or more, 4 hours or more, 6 hours or more, or 16 hours or more.

Before applying the photoresist composition onto the substrate 100, an etching target film (not shown) may be further formed on the substrate 100. The etching target film may refer to a layer in which images are transcribed from photoresist patterns and converted into predetermined patterns. In an embodiment, the etching target film may include, for example, insulating materials such as silicon oxide, silicon nitride, or silicon oxynitride. In some embodiments, the etching target film may to include conductive materials such as metal, metal nitride, metal silicide, or a metal silicide nitride film. In some embodiments, the etching target film may include semiconductor materials such as polysilicon.

In an embodiment, an anti-reflection film and a photoresist film may be sequentially formed on the etching target film.

Thereafter, at least a portion of the photoresist film 110 may be exposed using high-energy light. For example, at least a portion of the photoresist film 110 may be exposed to high-energy light by using a mask 120 known in the art. Accordingly, the photoresist film 110 may have an exposed portion 111 and an unexposed portion 112. As described above, the bond between the phenyl ring of tyrosine and the main backbone chain is broken due to the irradiation of high-energy light onto the exposed portion 111 of the photoresist film 110 to form quinone methide. The quinone methide breaks the hydrogen bond between the β-sheets of the region A to change the solubility of the polypeptide in water, and thus, the polypeptide in the exposed region of photoresist film 111 becomes water-soluble. Accordingly, the exposed portion 111 may be water-soluble and the unexposed portion 112 may be water-insoluble. Accordingly, the unexposed portion 112 is not removed by the developer, thereby providing a positive-tone development.

The high-energy light may have a wavelength of 200 nm or less. Specifically, a source of the high-energy light may be an ArF excimer laser having a wavelength of 193 nm or an ozone lamp having a wavelength of 184.9 nm. More specifically, the high-energy light may be sourced from an ArF excimer laser having a wavelength of 193 nm.

In an embodiment, with the use of an ArF excimer laser the exposed portion 111 may be irradiated for about 2 minutes to 10 minutes. In this case, an amount of irradiation per minute may be about 4 millijoules per square centimeter ($mJ/cm^2$) to about 60 $mJ/cm^2$, or about 10 $mJ/cm^2$ to about 20 $mJ/cm^2$.

Next, the exposed photoresist film 110 may be developed by using a developer. As the exposed portion 111 is water-soluble, the exposed portion 111 may be washed off by the developer when for example water is used as a developer. As the unexposed portion 112 is water-insoluble, it remains, i.e., without being washed off by the developer.

Examples of the developing method may include methods such as spin coating, dipping, or puddle coating, and the developing may take time to effectively remove the exposed portion 111 about 5 seconds to about 2 minutes, or about 1 minute.

In an embodiment, the developer may consist of water. When a developer consisting of water is used, the crystallized photoresist film 110 may be less affected by the developer. Accordingly, it may be easier to control the photoresist film 110 to a desired thickness than when using a developer including other organic solvents other than water, for example, methanol. In addition, since water is used as the developer and no additional additives are required, although time of exposure and productivity are maintained in a similar level as conventional methods in the overall process, water may simultaneously perform the functions of development and washing to provide a simplified process with significantly reduced costs and/or time. In particular, a method of making a pattern may reduce exposure to potentially toxic substances and/or reduce the need for organic solvents in the semiconductor production patterning process.

The method of forming patterns according to an embodiment of the present disclosure may further include baking, etching, stripping, and the like, which are performed in a general photolithography process.

EXAMPLES

Synthesis Example 1: Synthesis of Polypeptide $HA_8B_4$

The following method was used to synthesize a polypeptide having a sequence of $HA_8B_4$ shown in Table 1.

produce $HA_8B_4$ polypeptide of Table 1, and the cleaved nucleotide was loaded into pUC57 vector to synthesize pUC57-$HA_8B_4$ vector. The synthesized pUC57-$HA_8B_4$ vector was treated with ThermoFisher Fermentas™ NcoI and XhoI restriction enzymes, electrophoresed on Bio-Rad Certified Molecular Biology agarose gel, and the gel was cut out and eluted with GeneAll Hybrid-Q™ to obtain $HA_8B_4$ synthetic gene DNA. pET30a vector DNA was obtained in the same manner as described above, mixed with the previously obtained $HA_8B_4$ synthetic gene DNA, and treated with Takara T4 DNA ligase at 16° C. for 2 hours. Thereafter, the obtained gene DNA was mixed with HIT™-DH5a competent cells, and the mixture was subjected to heat shock at 42° C. for 30 seconds to introduce DNA into the cells. and The cells were streaked on Luria-Bertani (LB) solid medium containing kanamycin to obtain a colony into which a vector cloned with the synthetic gene in pET30a was introduced. The obtained colony was inoculated into 3 mL of LB liquid medium containing kanamycin and then shaking-cultured at 37° C. and 250 rpm overnight. The colony was subjected to

TABLE 1

| No. of Synthesis Example | Name of polypeptide | Sequence |
|---|---|---|
| Synthesis Example 1 | $HA_8B_4$ | [N-terminal]-GAGAGSGAAS-[GAGAGS]$_8$-GAGAGY-GAGVGAGY-GAGY-GAGAGAGY-[C-terminal] (SEQ ID NO: 11) |
| Synthesis Example 2 | $HA_8B_4D_2$ | [N-terminal]-GAGAGSGAAS-GAGAGS]$_8$-GAGAGY-GAGVGAGY-GAGY-GAGAGAGY-DD-[C-terminal] (SEQ ID NO: 12) |
| Synthesis Example 3 | $HA_8B_4D_6$ | [N-terminal]-GAGAGSGAAS-[GAGAGS]$_8$-GAGAGY-GAGVGAGY-GAGY-GAGAGAGY-DDDDDD-[C-terminal] (SEQ ID NO: 13) |
| Synthesis Example 4 | $HA_8B_4E_2$ | [N-terminal]-GAGAGSGAAS-[GAGAGS]$_8$-GAGAGY-GAGVGAGY-GAGY-GAGAGAGY-EE-[C-terminal] (SEQ ID NO: 14) |
| Synthesis Example 5 | $HA_8B_4DE$ | [N-terminal]-GAGAGSGAAS-[GAGAGS]$_8$-GAGAGY-GAGVGAGY-GAGY-GAGAGAGY-DE-[C-terminal] (SEQ ID NO: 15) |
| Synthesis Example 6 | $HA_8B_4(DE)_3$ | [N-terminal]-GAGAGSGAAS-[GAGAGS]$_8$-GAGAGY-GAGVGAGY-GAGY-GAGAGAGY-DEDEDE-[C-terminal] (SEQ ID NO: 16) |
| Synthesis Example 7 | $HA_1B_4$ | [N-terminal]-GAGAGSGAAS-GAGAGS-GAGAGY-GAGVGAGY-GAGY-GAGAGAGY-[C-terminal] (SEQ ID NO: 17) |
| Synthesis Example 8 | $HA_1B_6$ | [N-terminal]-GAGAGSGAAS-GAGAGS-GAGAGY-GAGVGAGY-GAGAGY-GAGVGAGY-GAGY-GAGAGAGY-[C-terminal] (SEQ ID NO: 18) |
| Synthesis Example 9 | $HA_1B_4D_6$ | [N-terminal]-GAGAGSGAAS-GAGAGS-GAGAGY-GAGVGAGY-GAGY-GAGAGAGY-DDDDDD-[C-terminal] (SEQ ID NO: 19) |
| Synthesis Example 10 | $HA_1B_6D_6$ | [N-terminal]-GAGAGSGAAS-GAGAGS-GAGAGY-GAGVGAGY-GAGAGY-GAGVGAGY-GAGY-GAGAGAGY-DDDDDD-[C-terminal] (SEQ ID NO: 20) |

In Table 1, G is Gly, A is Ala, S is Ser, V is Val, Y is Tyr, D is aspartic acid, and E is Glu.

In Table 1, [GAGAGS]$_m$ means, a sequence of GAGAGS (SEQ ID NO:1) is repeated m times.

NcoI and XhoI restriction enzyme cleavage sites were set to be present at both ends of a nucleotide sequence that can miniprep with GeneAll Hybrid-Q™ to obtain a vector, and the obtained vector was treated with ThermoFisher Fermentas™ NcoI and XhoI restriction enzymes. The vector was electrophoresed on Bio-Rad Certified Molecular Biology Agarose gel containing AB materials SafeView™, and observed through Bio-Rad Gel-Doc XR+ system to confirm that the synthetic gene was cloned into pET30a. Using such method, pET30a-HA$_8$B$_4$ vector into which the synthetic gene DNA was introduced was prepared and confirmed.

The pET30a-HA$_8$B$_4$ vector was mixed with Invitrogen BL21(DE3) competent cells, and the mixture was subjected to heat shock at 42° C. for 30 seconds to introduce DNA into the cells. The cells were smeared on LB solid medium containing kanamycin to obtain a colony. The obtained colony was inoculated into 3 mL of LB liquid medium containing kanamycin and then shaking-cultured at 37° C. and 250 rpm overnight. The resulting culture solution (100 μl) was inoculated into 10 ml of LB liquid medium containing kanamycin, and grown until an optical density at a wavelength of 600 nm (OD$_{600}$)=0.5 at 37° C. and 250 rpm. The cells were further cultured at 37° C. and 250 rpm for 2 hours after 30 μl of 100 mM IPTG was added and subjected to centrifugation at 5,000 rpm for 10 minutes to collect the colony. The collected colony was resuspended in 700 μl of a pH 8.0 Tris-CI solution, and the cells were disrupted for 2 minutes at an amplitude of 25% using Sonics VCX-130 Ultrasonicator and subjected to centrifugation at 15,000 rpm for 10 minutes to obtain a supernatant. The supernatant (75 μl) and 25 μl of Bio-Rad 4× Laemmli Sample Buffer™ were mixed and treated at 95° C. for 5 minutes, and 15 μl of the mixture was loaded on Bio-Rad Any-kD™ gel, electrophoresed at 200 V for 30 minutes by using a Bio-Rad Mini-PROTEAN device, and stained with Bio-Rad Coomassie Brilliant Blue R-250 Staining Solution to confirm the expression of the synthetic gene. Using such a method, a protein-producing colony was prepared and the expression was confirmed.

The colony confirmed to have the desired polypeptide expression was inoculated in 50 mL of LB liquid medium containing kanamycin and then shaking-cultured at 37° C. and 250 rpm overnight. The resulting culture solution (100 μl) was inoculated into 1 L of LB liquid medium containing kanamycin, grown until OD$_{600}$=0.5 at 37° C. and 250 rpm, and then further cultured at 37° C. and 250 rpm for 3 hours after 300 μl of 1 M IPTG was added. The obtained was subjected to centrifugation at 5,000 rpm for 10 minutes to collect the colony. The collected colony was resuspended in 10 ml of a pH 8.0 Tris-CI solution, and the cells were disrupted for 5 minutes at an amplitude of 40% using Sonics VCX-750 Ultrasonicator and subjected to centrifugation at 15,000 rpm for 30 minutes to obtain a supernatant. The obtained supernatant was passed through 1 mL of Qiagen Ni-NTA agarose resin, passed through 15 mL of a pH 8.0 Tris-CI solution containing 10 mM imidazole to wash the resin, and lastly the resin was eluted with 3 mL of a pH 8.0 Tris-CI solution containing 100 mM imidazole to purify a desired polypeptide. 15 μl of the purified polypeptide and 5 μl of Biorad 4× Laemmli Sample Buffer™ were mixed, heated at 95° C. for 5 minutes, 5 μl the resulting mixture was loaded to Bio-Rad Any-kD™ gel, electrophoresed at 200 V for 30 minutes by using a Bio-Rad Mini-PROTEAN device, and stained with Bio-Rad Coomassie Brilliant Blue R-250 Staining Solution to confirm the desired polypeptide.

Synthesis Examples 2 to 10: Synthesis of Polypeptide

Polypeptides were synthesized in the same manner as in Synthesis Example 1, except that site directed mutagenesis was used to clone instead of pET30a-HA$_8$B$_4$ vector to obtain a vector that can produce polypeptides of Synthesis Examples 2 to 10 described in Table 1.

Evaluation Example 1: Measurement of Viscosity, Isoelectric Point (pI), and Solubility The purified protein solution obtained in the synthesis examples was concentrated to 3.5 w/v % using Merck Amicon® Stirred Cells™ and Ultracell 1 Kda membrane filter. Thermo-Fisher SnakeSkin™ dialysis tubing (3.5K MWCO 16 mm ID) was cut to 7 cm in length, soaked in 500 mL of tertiary distilled water for 15 minutes, and taken out, and the tubing was washed inside and outside three times using 50 mL of tertiary distilled water. Then, 5 mL of a sample was put into the washed tubing, which was closed at both sides with forceps, and the dialysis tubing containing the sample concentrated to 3.5 w/v % was put in 1 L of tertiary distilled water and subjected to dialysis at 20° C. for 4 hours by replacing the distilled water with 1 L of fresh tertiary distilled water every 1 hour to obtain a 3.5 w/v % polypeptide aqueous solution. A viscosity of the polypeptide solution was measured by a Vibro viscometer sv-10 and the results are shown in Table 2. A viscosity of distilled water that does not contain a polypeptide was also measured as a baseline and the results are shown in Reference Example 1-2 of Table 2.

Here, isoelectric point (pI) and solubility values were each calculated based on the sequence, by using a software Protein-sol.

TABLE 2

| Example No. | Sample No. | Polypeptide | Viscosity (mPa · s) | pI | Solubility |
|---|---|---|---|---|---|
| Example 1-1 | Sample 1 | HA$_8$B$_4$D$_2$ | 63 | 5.94 | 0.757 |
| Example 1-2 | Sample 2 | HA$_8$B$_4$D$_6$ | 49 | 4.83 | 0.785 |
| Example 1-3 | Sample 3 | HA$_8$B$_4$E$_2$ | 52 | 5.95 | 0.716 |
| Example 1-4 | Sample 4 | HA$_8$B$_4$(DE)$_3$ | 51 | 4.91 | 0.782 |
| Ref. Example 1-1 | Ref. Sample 1 | HA$_8$B$_4$ | 70 | 6.44 | 0.62 |
| Ref. Example 1-2 | — | None | 2.33 | — | — |
| Ref. Example 1-3 | Ref. Sample 2 | HA$_1$B$_4$ | 52.5 | 6.44 | 0.745 |
| Ref. Example 1-4 | Ref. Sample 3 | HA$_1$B$_6$ | 62 | 6.44 | 0.687 |
| Example 1-5 | Sample 5 | HA$_1$B$_4$D$_6$ | 48 | 4.83 | 0.890 |
| Example 1-6 | Sample 6 | HA$_1$B$_6$D$_6$ | 49.2 | 4.83 | 0.856 |

Referring to Table 2, it can be confirmed that a viscosity of the polypeptides of Example 1-1 to 1-4 is lower than a viscosity of Reference Example 1-1. In particular, Example 1-2 to 1-4 have a viscosity that is about 30% lower than Reference Example 1-1.

Referring to Table 2, one confirms that a viscosity of the polypeptides of Examples 1-5 and 1-6 are lower than a viscosity of Reference Examples 1-3 and 1-4, respectively. In particular, the viscosity of Example 1-5 is 9% lower than that of Reference Example 1-3, and the viscosity of Example 1-6 is 20% lower than that of Reference Example 1-4.

Evaluation Example 2: Evaluation of Crystallinity of Polypeptide and Characteristics as Photoresist A 1.5 cm square silicon wafer was washed for 30 minutes by using a Jelight UVO144AX-220 UV-ozone cleaner, 100 μl of Samples 2 to 6 and Reference Samples 1 to 3, which were used in Evaluation Example 1, were each applied on the silicon wafer, and spin-coated at 300 RPM for 5 seconds, at 3000 RPM for 40 seconds, and at 500 RPM for 5 seconds using a MIDAS Spin Controller. The spin-coated wafer was dried at 95° C. for 1 minute by using a Daehan Scientific HP-LP hot plate, and then treated for 16 hours at 95° C. and 92% humidity by using an ESPAC SH-661 thermo-hygrostat to remove moisture and to form a polypeptide film. The silicon wafer on which the polypeptide film is to be formed was stored in a desiccator until exposed to the high energy light.

Evaluation of Crystallinity

Figure 3:
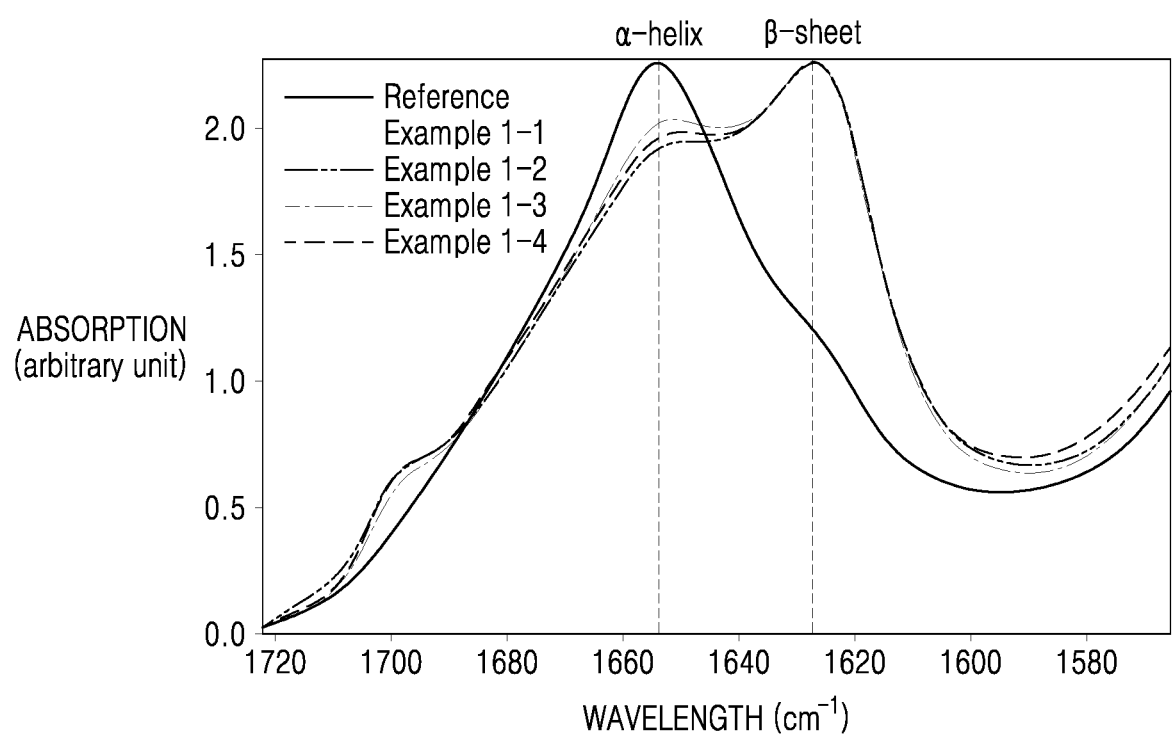
FIG. 3 is a diagram illustrating a secondary structure analysis through FT-IR analysis of Example 1-2, SEQ ID NO: 13; Example 1-3, SEQ NO: 14; and 1-4, SEQ ID NO: (16) and Reference Example 1-1, SEQ ID NO: 12.

The silicon wafer on which the polypeptide film was formed was scanned using Fourier-transform infrared spectroscopy (FT-IR) in a range of 650 $cm^{-1}$ to 4,000 $cm^{-1}$ at an interval of 1.92 $cm^{-1}$ using a Bruker Varian 670 FT-IR ATR. A 2nd derivation conversion and a FSD conversion were performed on the amide 1 portion (1595 $cm^{-1}$ to 1705 $cm^{-1}$) of the measurement results using Bruker OPUS ver.7.0, and a curve fitting was performed to analyze the secondary structure of the film polypeptide. The secondary structure of the polypeptide film was analyzed as follows depending on the peak positions fitted by FSD, and some of the results are shown in FIG. 3: β-sheet structures of 1610 $cm^{-1}$ to 1625 $cm^{-1}$ and 1696 $cm^{-1}$ to 1704 $cm^{-1}$; random coil structures of 1640 $cm^{-1}$ to 1650 $cm^{-1}$; α-helix structures of 1650 $cm^{-1}$ to 1660 $cm^{-1}$; and β-turn structures of 1660 $cm^{-1}$ to 1695 $cm^{-1}$. Based on the above-described analysis, the ratio of the β-sheet structure portion to the amide I portion is defined as crystallinity and shown in Table 3.

Referring to FIG. 3, Samples 2, 3, and 4 are each shown to have less α-helix structures and more β-sheet structures than Reference sample 1.

Evaluation of LWR and CD

A pattern mask was placed on the silicon wafer on which the polypeptide film was formed, and the sample was exposed using an ArF excimer laser with various exposure amounts of 4.24 $mJ/cm^2$ to 60 $mJ/cm^2$. Following exposure, the wafers are dipped in water for 1 minute to develop. Line width roughness (LWR) and critical dimension (CD) of the obtained patten were evaluated as follows.

The pattern mask was prepared by performing a lithography on a fused silica using E-beam, and lifting-off, and has 500 nm line and space (L/S) patterns.

A line width roughness (LWR) was obtained by measuring values from 10 sites in the longitudinal direction of a line of the obtained pattern using an atomic-force microscopy equipment and calculating the standard deviation times 3 (3σ), which is a line width roughness. The smaller the value, the smaller the roughness, and a pattern having a uniform line width may be obtained.

Critical dimension (CD) was obtained by measuring values from 10 sites in the longitudinal direction of a line of the obtained pattern using an atomic-force microscopy equipment. In the disclosure, it was confirmed that the higher the value, the higher the sensitivity of the sample.

The evaluated crystallinity, LWR, and CD values of Samples 2 to 6, and Reference Samples 1 to 3 are shown in Table 3 below.

TABLE 3

| Example No. | Sample No. | Polypeptide (SEQ ID NO:) | Crystallinity (%) | LWR (nm) | CD (nm) |
| --- | --- | --- | --- | --- | --- |
| Example 2-1 | Sample 2 | $HA_8B_4D_6$ (13) | 44.7 | 8 | 500 |
| Example 2-2 | Sample 3 | $HA_8B_4E_2$ (14) | 45.6 | 10 | 450 |
| Example 2-3 | Sample 4 | $HA_8B_4(DE)_3$ (16) | 43.7 | 8 | 500 |
| Ref. Example 2-1 | Ref. Sample 1 | $HA_8B_4$ (11) | 39.0 | 15 | 230 |
| Ref. Example 2-2 | Ref. Sample 2 | $HA_1B_4$ (17) | 46.2 | 9 | 505 |
| Ref. Example 2-3 | Ref.e Sample 3 | $HA_1B_6$ (18) | 50.5 | 11 | 677 |
| Example 2-4 | Sample 5 | $HA_1B_4D_6$ (19) | 43.9 | — | — |
| Example 2-5 | Sample 6 | $HA_1B_6D_6$ (20) | 43.2 | — | — |

Referring to Table 3, Examples 2-1 to 2-5, each of which includes a region C, exhibit a higher crystallinity, a decreased LWR, and an increased CD, compared to Reference Examples 2-1, 2-2, and 2-3. Specifically, it was shown from the results of Table 3 that Example s 2-1, 2-2, and 2-3 have about 2.1 times improved CD characteristics and about 1.8 times improved LWR characteristics, compared to Reference Example 2-1.

An embodiment of the present disclosure can provide a photoresist composition having an improved sensitivity, an improved LWR, and/or a critical dimension (CD). In addition, when patterns are formed by using the photoresist composition, manufacturing processes are simplified and disposal cost for generated by-products are also reduced, and thus, manufacturing costs may be reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A polypeptide consisting of a region A, a region B, a region C, and a region H, wherein the region A is disposed between the region H and the region B, wherein the region A, the region B, and the region C, are consecutively arranged, wherein the region A has an alanine content of 20% or more and consists of a first repeat unit having 4 to 10 consecutive amino acid residues, the region B has a tyrosine content of 10% or more and consists of a second repeat unit having 4 to 10 consecutive amino acid residues, and the region C has a content of 50-70% or more of at least one of aspartic acid or glutamic acid, and consists of a third repeat unit having 2 to 8 consecutive amino acid residues, the polypeptide has a weight average molecular weight of about 3,000 g/mol to about 10,000 g/mol, and wherein the first repeat unit is represented by Formula 1,
the second repeat unit is represented by Formula 2,
the third repeat unit repeat unit is represented by Formula 3, and
the region H is represented by Formula 4:

$$X_{11}\text{-}(Ala\text{-}X_{12})n11\text{-}X_{13}, \quad \text{Formula 1}$$

$$X_{21}\text{-}(X_{22}\text{-}X_{23})n21\text{-}Tyr, \quad \text{Formula 2}$$

$$X_{31}\text{-}(X_{32}\text{-}X_{33})n31\text{-}X_{34}, \quad \text{Formula 3}$$

$$X_{41}\text{-}(Ala\text{-}X_{42})n41\text{-}X_{43}\text{-}Gly\text{-}Ala\text{-}Ala\text{-}Ser, \quad \text{Formula 4}$$

wherein in Formulae 1, 2, 3, and 4

$X_{11}$ and $X_{12}$ are each independently Gly or Ala, $X_{13}$ is Ser or Ala, and n11 is an integer of 1 to 4;

$X_{21}$ and $X_{23}$ are each independently Gly or Ala, $X_{22}$ is Gly, Ala, or Val, and n21 is an integer of 1 to 4;

$X_{31}$ to $X_{34}$ are each independently Asp or Glu, and n31 is an integer of 0 to 3; and $X_{41}$ and $X_{42}$ are each independently Gly or Ala, $X_{43}$ is Ser or Ala, and n41 is 1 or 2.

2. The polypeptide of claim 1, wherein the third repeat unit consists of aspartic acid or glutamic acid.

3. The polypeptide of claim 1, wherein, in Formula 1, $X_{11}$ and $X_{12}$ are each Gly, $X_{13}$ is Ser, and n11 is 1 or 2, and in Formula 2, $X_{21}$ and $X_{23}$ are each Gly, $X_{22}$ is Ala or Val, and n21 is 1, 2, or 3.

4. The polypeptide of claim 1, wherein the first repeat unit is Gly-Ala-Gly-Ala-Gly-Ser (SEQ ID: 1) or Gly-Ala-Ala-Ser (SEQ ID: 2), the second repeat unit is Gly-Ala-Gly-Tyr (SEQ ID: 3), Gly-Ala-Gly-Ala-Gly-Tyr (SEQ ID: 4), Gly-Ala-Gly-Val-Gly-Ala-Gly-Tyr (SEQ ID: 5), or Gly-Ala-Gly-Ala-Gly-Ala-Gly-Tyr (SEQ ID: 6), and the third repeat unit is Glu-Glu, Asp-Asp, Asp-Glu-Asp-Glu-Asp-Glu (SEQ ID: 7), or Asp-Asp-Asp-Asp-Asp-Asp (SEQ ID: 8).

5. The polypeptide of claim 1, wherein the region A has 2 to 12 of the first repeat units,
the region B has 2 to 6 of the second repeat units, and
the region C has 2 to 5 of the third repeat units.

6. The polypeptide of claim 1, wherein the region H is-Gly-Ala-Gly-Ala-Gly-Ser-Gly-Ala-Ala-Ser (SEQ ID: 10).

7. The polypeptide of claim 1, wherein the polypeptide has a viscosity of less than 70 milliPascals second at 25° C.

8. The polypeptide of claim 4, wherein the region H is-Gly-Ala-Gly-Ala-Gly-Ser-Gly-Ala-Ala-Ser (SEQ ID: 10).

9. The polypeptide of claim 4, wherein the polypeptide has a crystallinity of 40% or more.

10. The polypeptide of claim 4, wherein the polypeptide has a water solubility of 0.7 g/ml to 0.9 g/ml at 25° C.

11. A photoresist composition comprising the polypeptide of claim 1, and water.

12. The composition of claim 11, wherein the photoresist composition has a polypeptide concentration of about 0.1 w/v % to about 20 w/v %.

13. A method of forming patterns, the method comprising:

applying the photoresist composition of claim 11 onto a substrate;

heating the applied composition to form a photoresist film;

exposing at least a portion of the photoresist film to high-energy light; and developing the exposed photoresist film with a developer, wherein the high-energy light has a wavelength of 200 nanometers or less.

14. The method of claim 13, wherein the heating is performed at about 50° C. to about 95° C.

15. The method of claim 13, wherein the high-energy light is sourced from an ArF excimer laser having a wavelength of 193 nanometers.

16. The method of claim 13, wherein the developer consists of water.

17. The method of claim 13, wherein the portion of the photoresist film exposed to the high-energy light is washed off by water as a developer.

* * * * *

SEQUENCE LISTING

```
<160> NUMBER OF SEQ ID NOS: 21

<210> SEQ ID NO 1
<211> LENGTH: 6
<212> TYPE: PRT
<213> ORGANISM: Artificial Sequence
<220> FEATURE:
<223> OTHER INFORMATION: Artificial polypeptide
<220> FEATURE:
<221> NAME/KEY: FirstRepeatUnit1
```

```
<222> LOCATION: (1)..(6)

<400> SEQUENCE: 1

Gly Ala Gly Ala Gly Ser
1               5

<210> SEQ ID NO 2
<211> LENGTH: 4
<212> TYPE: PRT
<213> ORGANISM: Artificial Sequence
<220> FEATURE:
<223> OTHER INFORMATION: Artificial polypeptide
<220> FEATURE:
<221> NAME/KEY: FirstRepeatUnit2
<222> LOCATION: (1)..(4)

<400> SEQUENCE: 2

Gly Ala Ala Ser
1

<210> SEQ ID NO 3
<211> LENGTH: 4
<212> TYPE: PRT
<213> ORGANISM: Artificial Sequence
<220> FEATURE:
<223> OTHER INFORMATION: Artificial polypeptide
<220> FEATURE:
<221> NAME/KEY: SecondRepeatUnit1
<222> LOCATION: (1)..(4)

<400> SEQUENCE: 3

Gly Ala Gly Tyr
1

<210> SEQ ID NO 4
<211> LENGTH: 6
<212> TYPE: PRT
<213> ORGANISM: Artificial Sequence
<220> FEATURE:
<223> OTHER INFORMATION: Artificial polypeptide
<220> FEATURE:
<221> NAME/KEY: SecondRepeatUnit2
<222> LOCATION: (1)..(6)

<400> SEQUENCE: 4

Gly Ala Gly Ala Gly Tyr
1               5

<210> SEQ ID NO 5
<211> LENGTH: 8
<212> TYPE: PRT
<213> ORGANISM: Artificial Sequence
<220> FEATURE:
<223> OTHER INFORMATION: Artificial polypeptide
<220> FEATURE:
<221> NAME/KEY: SecondRepeatUnit3
<222> LOCATION: (1)..(8)

<400> SEQUENCE: 5

Gly Ala Gly Val Gly Ala Gly Tyr
1               5

<210> SEQ ID NO 6
<211> LENGTH: 8
<212> TYPE: PRT
<213> ORGANISM: Artificial Sequence
<220> FEATURE:
<223> OTHER INFORMATION: Artificial polypeptide
<220> FEATURE:
```

```
<221> NAME/KEY: SecondRepeatUnit4
<222> LOCATION: (1)..(8)

<400> SEQUENCE: 6

Gly Ala Gly Ala Gly Ala Gly Tyr
1               5

<210> SEQ ID NO 7
<211> LENGTH: 6
<212> TYPE: PRT
<213> ORGANISM: Artificial Sequence
<220> FEATURE:
<223> OTHER INFORMATION: Artificial polypeptide
<220> FEATURE:
<221> NAME/KEY: ThirdRepeatUnit1
<222> LOCATION: (1)..(6)

<400> SEQUENCE: 7

Asp Glu Asp Glu Asp Glu
1               5

<210> SEQ ID NO 8
<211> LENGTH: 6
<212> TYPE: PRT
<213> ORGANISM: Artificial Sequence
<220> FEATURE:
<223> OTHER INFORMATION: Artificial polypeptide
<220> FEATURE:
<221> NAME/KEY: ThirdRepeatUnit2
<222> LOCATION: (1)..(6)

<400> SEQUENCE: 8

Asp Asp Asp Asp Asp Asp
1               5

<210> SEQ ID NO 9
<211> LENGTH: 4
<212> TYPE: PRT
<213> ORGANISM: Artificial Sequence
<220> FEATURE:
<223> OTHER INFORMATION: Artificial polypeptide
<220> FEATURE:
<221> NAME/KEY: RegionH1
<222> LOCATION: (1)..(4)

<400> SEQUENCE: 9

Gly Ala Ala Ser
1

<210> SEQ ID NO 10
<211> LENGTH: 10
<212> TYPE: PRT
<213> ORGANISM: Artificial Sequence
<220> FEATURE:
<223> OTHER INFORMATION: Artificial polypeptide
<220> FEATURE:
<221> NAME/KEY: RegionH2
<222> LOCATION: (1)..(10)

<400> SEQUENCE: 10

Gly Ala Gly Ala Gly Ser Gly Ala Ala Ser
1               5                   10

<210> SEQ ID NO 11
<211> LENGTH: 84
<212> TYPE: PRT
<213> ORGANISM: Artificial Sequence
<220> FEATURE:
<223> OTHER INFORMATION: Artificial polypeptide
```

```
<220> FEATURE:
<221> NAME/KEY: SynthesisExample1
<222> LOCATION: (1)..(84)
<223> OTHER INFORMATION: HA8B4

<400> SEQUENCE: 11

Gly Ala Gly Ala Gly Ser Gly Ala Ala Ser Gly Ala Gly Ala Gly Ser
1               5                   10                  15

Gly Ala Gly Ala Gly Ser Gly Ala Gly Ala Gly Ser Gly Ala Gly Ala
            20                  25                  30

Gly Ser Gly Ala Gly Ala Gly Ser Gly Ala Gly Ala Gly Ser Gly Ala
        35                  40                  45

Gly Ala Gly Ser Gly Ala Gly Ala Gly Ser Gly Ala Gly Ala Gly Tyr
    50                  55                  60

Gly Ala Gly Val Gly Ala Gly Tyr Gly Ala Gly Tyr Gly Ala Gly Ala
65                  70                  75                  80

Gly Ala Gly Tyr

<210> SEQ ID NO 12
<211> LENGTH: 86
<212> TYPE: PRT
<213> ORGANISM: Artificial Sequence
<220> FEATURE:
<223> OTHER INFORMATION: Artificial polypeptide
<220> FEATURE:
<221> NAME/KEY: SynthesisExample2
<222> LOCATION: (1)..(86)
<223> OTHER INFORMATION: HA8B4D2

<400> SEQUENCE: 12

Gly Ala Gly Ala Gly Ser Gly Ala Ala Ser Gly Ala Gly Ala Gly Ser
1               5                   10                  15

Gly Ala Gly Ala Gly Ser Gly Ala Gly Ala Gly Ser Gly Ala Gly Ala
            20                  25                  30

Gly Ser Gly Ala Gly Ala Gly Ser Gly Ala Gly Ala Gly Ser Gly Ala
        35                  40                  45

Gly Ala Gly Ser Gly Ala Gly Ala Gly Ser Gly Ala Gly Ala Gly Tyr
    50                  55                  60

Gly Ala Gly Val Gly Ala Gly Tyr Gly Ala Gly Tyr Gly Ala Gly Ala
65                  70                  75                  80

Gly Ala Gly Tyr Asp Asp
            85

<210> SEQ ID NO 13
<211> LENGTH: 90
<212> TYPE: PRT
<213> ORGANISM: Artificial Sequence
<220> FEATURE:
<223> OTHER INFORMATION: Artificial polypeptide
<220> FEATURE:
<221> NAME/KEY: SynthesisExample3
<222> LOCATION: (1)..(90)
<223> OTHER INFORMATION: HA8B4D6

<400> SEQUENCE: 13

Gly Ala Gly Ala Gly Ser Gly Ala Ala Ser Gly Ala Gly Ala Gly Ser
1               5                   10                  15

Gly Ala Gly Ala Gly Ser Gly Ala Gly Ala Gly Ser Gly Ala Gly Ala
            20                  25                  30

Gly Ser Gly Ala Gly Ala Gly Ser Gly Ala Gly Ala Gly Ser Gly Ala
        35                  40                  45
```

Gly Ala Gly Ser Gly Ala Gly Ala Gly Ser Gly Ala Gly Ala Gly Tyr
            50                  55                  60

Gly Ala Gly Val Gly Ala Gly Tyr Gly Ala Gly Tyr Gly Ala Gly Ala
 65                  70                  75                  80

Gly Ala Gly Tyr Asp Asp Asp Asp Asp
            85                  90

<210> SEQ ID NO 14
<211> LENGTH: 86
<212> TYPE: PRT
<213> ORGANISM: Artificial Sequence
<220> FEATURE:
<223> OTHER INFORMATION: Artificial polypeptide
<220> FEATURE:
<221> NAME/KEY: SynthesisExample4
<222> LOCATION: (1)..(86)
<223> OTHER INFORMATION: HA8B4E2

<400> SEQUENCE: 14

Gly Ala Gly Ala Gly Ser Gly Ala Ala Ser Gly Ala Gly Ala Gly Ser
 1                5                  10                  15

Gly Ala Gly Ala Gly Ser Gly Ala Gly Ala Gly Ser Gly Ala Gly Ala
            20                  25                  30

Gly Ser Gly Ala Gly Ala Gly Ser Gly Ala Gly Ala Gly Ser Gly Ala
            35                  40                  45

Gly Ala Gly Ser Gly Ala Gly Ala Gly Ser Gly Ala Gly Ala Gly Tyr
            50                  55                  60

Gly Ala Gly Val Gly Ala Gly Tyr Gly Ala Gly Tyr Gly Ala Gly Ala
 65                  70                  75                  80

Gly Ala Gly Tyr Glu Glu
            85

<210> SEQ ID NO 15
<211> LENGTH: 86
<212> TYPE: PRT
<213> ORGANISM: Artificial Sequence
<220> FEATURE:
<223> OTHER INFORMATION: Artificial polypeptide
<220> FEATURE:
<221> NAME/KEY: SynthesisExample5
<222> LOCATION: (1)..(86)
<223> OTHER INFORMATION: HA8B4DE

<400> SEQUENCE: 15

Gly Ala Gly Ala Gly Ser Gly Ala Ala Ser Gly Ala Gly Ala Gly Ser
 1                5                  10                  15

Gly Ala Gly Ala Gly Ser Gly Ala Gly Ala Gly Ser Gly Ala Gly Ala
            20                  25                  30

Gly Ser Gly Ala Gly Ala Gly Ser Gly Ala Gly Ala Gly Ser Gly Ala
            35                  40                  45

Gly Ala Gly Ser Gly Ala Gly Ala Gly Ser Gly Ala Gly Ala Gly Tyr
            50                  55                  60

Gly Ala Gly Val Gly Ala Gly Tyr Gly Ala Gly Tyr Gly Ala Gly Ala
 65                  70                  75                  80

Gly Ala Gly Tyr Asp Glu
            85

<210> SEQ ID NO 16
<211> LENGTH: 90
<212> TYPE: PRT
<213> ORGANISM: Artificial Sequence
<220> FEATURE:

<223> OTHER INFORMATION: Artificial polypeptide
<220> FEATURE:
<221> NAME/KEY: SynthesisExample6
<222> LOCATION: (1)..(90)
<223> OTHER INFORMATION: HA8B4(DE)3

<400> SEQUENCE: 16

Gly Ala Gly Ala Gly Ser Gly Ala Ala Ser Gly Ala Gly Ala Gly Ser
1               5                   10                  15

Gly Ala Gly Ala Gly Ser Gly Ala Gly Ala Ser Gly Ala Gly Ala
            20                  25                  30

Gly Ser Gly Ala Gly Ala Gly Ser Gly Ala Gly Ala Gly Ser Gly Ala
        35                  40                  45

Gly Ala Gly Ser Gly Ala Gly Ala Ser Gly Ala Gly Ala Gly Tyr
    50                  55                  60

Gly Ala Gly Val Gly Ala Gly Tyr Gly Ala Gly Tyr Gly Ala Gly Ala
65                  70                  75                  80

Gly Ala Gly Tyr Asp Glu Asp Glu Asp Glu
                85                  90

<210> SEQ ID NO 17
<211> LENGTH: 42
<212> TYPE: PRT
<213> ORGANISM: Artificial Sequence
<220> FEATURE:
<223> OTHER INFORMATION: Artificial polypeptide
<220> FEATURE:
<221> NAME/KEY: SynthesisExample7
<222> LOCATION: (1)..(42)
<223> OTHER INFORMATION: HA1B4

<400> SEQUENCE: 17

Gly Ala Gly Ala Gly Ser Gly Ala Ala Ser Gly Ala Gly Ala Gly Ser
1               5                   10                  15

Gly Ala Gly Ala Gly Tyr Gly Ala Gly Val Gly Ala Gly Tyr Gly Ala
            20                  25                  30

Gly Tyr Gly Ala Gly Ala Gly Ala Gly Tyr
        35                  40

<210> SEQ ID NO 18
<211> LENGTH: 56
<212> TYPE: PRT
<213> ORGANISM: Artificial Sequence
<220> FEATURE:
<223> OTHER INFORMATION: Artificial polypeptide
<220> FEATURE:
<221> NAME/KEY: SynthesisExample8
<222> LOCATION: (1)..(56)
<223> OTHER INFORMATION: HA1B6

<400> SEQUENCE: 18

Gly Ala Gly Ala Gly Ser Gly Ala Ala Ser Gly Ala Gly Ala Gly Ser
1               5                   10                  15

Gly Ala Gly Ala Gly Tyr Gly Ala Gly Val Gly Ala Gly Tyr Gly Ala
            20                  25                  30

Gly Ala Gly Tyr Gly Ala Gly Val Gly Ala Gly Tyr Gly Ala Gly Tyr
        35                  40                  45

Gly Ala Gly Ala Gly Ala Gly Tyr
    50                  55

<210> SEQ ID NO 19
<211> LENGTH: 48
<212> TYPE: PRT

```
<213> ORGANISM: Artificial Sequence
<220> FEATURE:
<223> OTHER INFORMATION: Artificial polypeptide
<220> FEATURE:
<221> NAME/KEY: SynthesisExample9
<222> LOCATION: (1)..(48)
<223> OTHER INFORMATION: HA1B4D6

<400> SEQUENCE: 19

Gly Ala Gly Ala Gly Ser Gly Ala Ala Ser Gly Ala Gly Ala Gly Ser
1               5                   10                  15

Gly Ala Gly Ala Gly Tyr Gly Ala Gly Val Gly Ala Gly Tyr Gly Ala
                20                  25                  30

Gly Tyr Gly Ala Gly Ala Gly Ala Gly Tyr Asp Asp Asp Asp Asp Asp
            35                  40                  45

<210> SEQ ID NO 20
<211> LENGTH: 62
<212> TYPE: PRT
<213> ORGANISM: Artificial Sequence
<220> FEATURE:
<223> OTHER INFORMATION: Artificial polypeptide
<220> FEATURE:
<221> NAME/KEY: SynthesisExample10
<222> LOCATION: (1)..(62)
<223> OTHER INFORMATION: HA1B6D6

<400> SEQUENCE: 20

Gly Ala Gly Ala Gly Ser Gly Ala Ala Ser Gly Ala Gly Ala Gly Ser
1               5                   10                  15

Gly Ala Gly Ala Gly Tyr Gly Ala Gly Val Gly Ala Gly Tyr Gly Ala
                20                  25                  30

Gly Ala Gly Tyr Gly Ala Gly Val Gly Ala Gly Tyr Gly Ala Gly Tyr
            35                  40                  45

Gly Ala Gly Ala Gly Ala Gly Tyr Asp Asp Asp Asp Asp Asp
        50                  55                  60

<210> SEQ ID NO 21
<211> LENGTH: 8
<212> TYPE: PRT
<213> ORGANISM: Artificial polypeptide
<220> FEATURE:
<223> OTHER INFORMATION: Artificial Polypeptide
<220> FEATURE:
<221> NAME/KEY: misc_feature
<222> LOCATION: (1)..(1)
<223> OTHER INFORMATION: Xaa at position 1 can be gly or ala
<220> FEATURE:
<221> NAME/KEY: misc_feature
<222> LOCATION: (2)..(3)
<223> OTHER INFORMATION: (2)..(3) can be repeated 1 or 2 times, Xaa can
      be Gly or Ala
<220> FEATURE:
<221> NAME/KEY: misc_feature
<222> LOCATION: (4)..(4)
<223> OTHER INFORMATION: Xaa at position 4 can be Ser or Ala

<400> SEQUENCE: 21

Xaa Ala Xaa Xaa Gly Ala Ala Ser
1               5
```